United States Patent [19]
Siegel et al.

[11] Patent Number: 5,994,774
[45] Date of Patent: Nov. 30, 1999

[54] SURFACE MOUNTABLE INTEGRATED CIRCUIT PACKAGE WITH DETACHABLE MODULE AND INTERPOSER

[75] Inventors: Harry Michael Siegel, Hurst; Michael Joseph Hundt, Double Oak; Robert H. Bond, Plano, all of Tex.

[73] Assignee: STMicroelectronics, Inc., Carrollton, Tex.

[21] Appl. No.: 08/960,947

[22] Filed: Oct. 30, 1997

[51] Int. Cl.⁶ .......................... H01L 23/34; H01L 23/02; H01L 23/06; H01L 23/48
[52] U.S. Cl. .......................... 257/727; 257/678; 257/684; 257/697; 361/785; 439/86; 439/586
[58] Field of Search ...................................... 257/678, 684, 257/727, 924, 697; 361/785; 439/43, 55, 86

[56] References Cited

U.S. PATENT DOCUMENTS

| | | | |
|---|---|---|---|
| 5,557,504 | 9/1996 | Siegel et al. | 361/173 |
| 5,821,691 | 10/1998 | Gerber et al. | 257/726 |
| 5,825,630 | 10/1998 | Taylor et al. | 361/790 |

Primary Examiner—Teresa M. Arroyo
Attorney, Agent, or Firm—David V. Carlson; Theodore E. Galanthay; Lisa K. Jorgenson

[57] ABSTRACT

A modular integrated circuit package is mounted on a surface of a printed circuit board. The integrated circuit package includes a rigid interposer releasably coupling a component module to a substrate member designed to be affixed to the printed circuit board. The substrate member has a first side with plural first electrical connectors for connection to the circuit board and a second side with second electrical connectors coupled to the first electrical connectors. The interposer includes a plurality of electrical connectors that couple electrical connectors of the component module to the second electrical connectors of the substrate member. The component module also includes plural clip members that engage a lower surface of the interposer to releasably couple the component module to the interposer.

20 Claims, 3 Drawing Sheets

5,994,774

SURFACE MOUNTABLE INTEGRATED CIRCUIT PACKAGE WITH DETACHABLE MODULE AND INTERPOSER

TECHNICAL FIELD

The present invention relates to integrated circuits, and more particularly, to surface mountable integrated circuit packages.

BACKGROUND OF THE INVENTION

In the field of electronic system manufacturing, the use of surface mount technology to attach and connect integrated circuit components onto printed circuit boards has continued to grow. As is known in the art, surface mountable integrated circuit packages have leads or pins that allow for their solder connection to a planar surface of a circuit board, eliminating the need for plated-through holes through the circuit board. Surface mount technology thus increases the theoretical component density of the circuit board, as well as the degrees of freedom available to the board designer, as the location of integrated circuit leads need only be considered for a single surface plane of a multi-layer circuit board, rather than for all planes of the board.

However, the surface mountable integrated circuit is subjected to greater thermal and mechanical stress during the assembly procedure than are integrated circuits of the dual-in-line and similar package types. The mounting of a dual-in-line integrated circuit package to the circuit board is accomplished by wave solder of the underside of the circuit board (i.e., the side opposite that of the integrated circuit), as the pins of the integrated circuit package extend through plated through-holes in the circuit board. Accordingly, the circuit board itself insulates the integrated circuit package body from the high solder temperatures and harsh chemicals to which the soldered lead tips are subjected. Since the leads of a surface mountable package are soldered at the same surface at which the integrated circuit package body is located, however, the integrated circuit package body and its contents are directly subjected to the high temperature of the flowing solder, and to harsh chemicals used in the soldering process, such as flux, solder, and cleaning solvents.

Conventional surface-mountable integrated circuits that contain only a semiconductor device and its wire connections are generally able to withstand the thermal, chemical and mechanical stresses presented by the surface mount process. As such, the use of surface mount techniques in the manufacture of circuit boards of many types has become widespread, obtaining the density advantages provided by this technology.

In recent years, the use of battery power for many electronic circuit functions has become available, primarily due to advances made in complementary metal-oxide-semiconductor (CMOS) fabrication and design technology. As is well known, CMOS integrated circuits are able to operate with extremely low active power requirements; in the case of CMOS memory devices, such as static random access memories (SRAMs), the power requirements for data retention are especially low. These low power requirements allow operation and data retention in electronic systems to be powered by conventional lithium batteries and other cell types, improving the portability and reliability of modern electronic systems.

It has therefore become desirable to provide a battery with an integrated circuit in a single package, so that battery backup functionality may be easily implemented in the system. Example of packages containing both a semiconductor integrated circuit and a battery, for use in surface mount applications, are described in U.S. Pat. No. 5,557,504 ("the '504 patent"), assigned to SGS-Thomson Microelectronics, Inc., which is incorporated herein by reference.

As described in the '504 patent, conventional batteries are unable to reliably withstand the temperatures and chemical conditions to which an integrated circuit is subjected during surface mount assembly, however. For example, some types of batteries can be irreparably damaged by exposure to temperatures as low as 181° C. which is below the temperature of certain solders used in the surface mount process. Other components, such as quartz crystal resonators used in connection with on-chip oscillators, are also vulnerable to these harsh environmental conditions. The harsh chemical environment of the surface mount process can also damage the physical construction of these components.

The '504 patent discloses an integrated circuit package 10 that includes a component module 12 releasably affixed to a small outline integrated circuit (SOIC) chip package 14, as shown in FIG. 1. The component module 12 includes a battery or other temperature or chemical sensitive devices (not shown) encased within a plastic body 16. Extending downward from the component module body 16 are a plurality of electrical connector pins 18 that are sized to be coupled with corresponding female connectors 20 in the SOIC chip package 14. Also extending downward from the component module body 16 are snap members 22 that releasably engage lower surfaces 24 of the SOIC chip package 14 to releasably couple the component module 12 to the SOIC chip package 14.

As is typical, extending from opposite sides 26, 28 of the SOIC chip package 14 are electrical leads 30 that are bent downward in order to electrically connect the SOIC chip package 14 to a surface of a printed circuit board (not shown). The SOIC chip package 14 is a rigid and relatively thick package, encompassing one or more integrated circuits, that is sufficiently strong to support being engaged by the snap members 22. In contrast, many other types of chip packages, such as ball-grid array (BGA) packages are too thin to support being engaged by the snap members 22.

SUMMARY OF THE INVENTION

An embodiment of the invention is directed to a modular surface mountable integrated circuit package that enables a component module with temperature and/or chemical sensitive electrical devices to be releasably coupled to a printed circuit board. The integrated circuit package includes a substrate member having first and second sides with the first side including a plurality of first electrical connectors for connection to the circuit board. The second side includes a plurality of second electrical connectors coupled to the first electrical connectors. The integrated circuit package also includes a component module having a plurality of electrical connectors extending from a module body. A rigid interposer couples the component module to the substrate member. The interposer includes a plurality of electrical connectors coupling the electrical connectors of the component module to the second electrical connectors of the substrate member.

The component module may include a plurality of clip members extending from a peripheral edge of a bottom surface of the module body. Each clip member includes a main portion that extends along a side of the interposer and a hook portion that engages a lower side of the interposer to releasably couple the component module to the interposer. As a result, the interposer enables the component module to be securely, yet releasably, coupled to the substrate member without requiring the substrate member to be designed, like an SOIC chip package, to be rigid and spacious enough to be coupled directly to the component module.

DETAILED DESCRIPTION OF THE INVENTION

Figure 2:
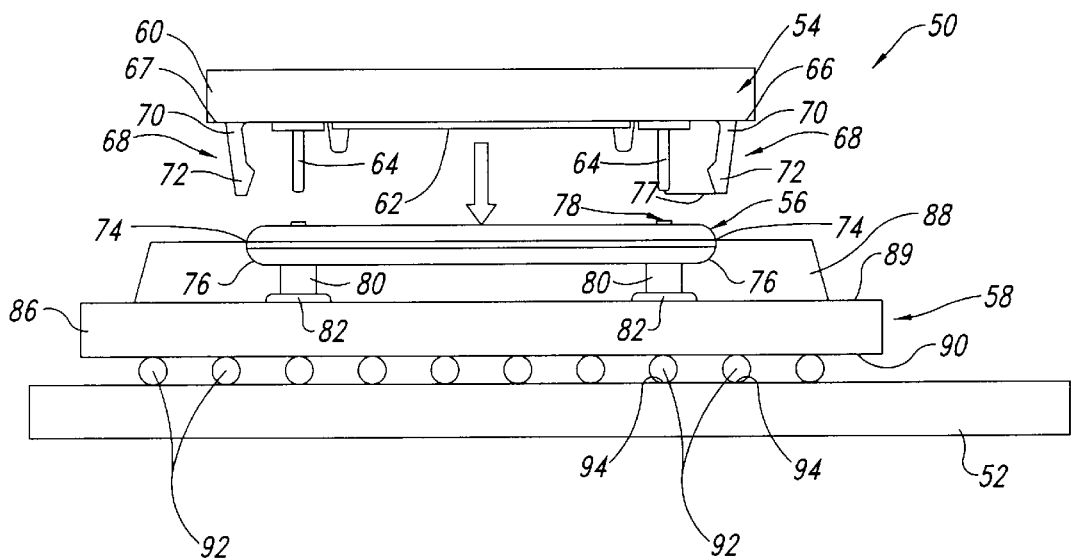
FIG. 2 is an exploded, side elevational view of a modular integrated circuit package according to the present invention.

A modular integrated circuit package 50 according to a first embodiment of the present invention is shown in FIG. 2. The integrated circuit package 50 is connected to a printed circuit board (PCB) 52 and includes a component module 54, a rigid interposer 56, and a chip package 58. The interposer 56 physically and electrically couples the component module 54 to the molded chip package 58.

The component module 54 includes a sealed module body that encloses one or more electrical components (not shown) that are sensitive to solder temperature or to harsh chemical environments, such as electrochemical cells and crystal resonators. As is known in the art, electrochemical cells are commonly used to provide battery back-up power to an integrated circuit and crystal resonators are often used to set a stable frequency reference for an on-chip oscillator circuit. Examples of integrated circuits that may use both of these components include timekeeper circuits and clocked logic devices based on a steady clock frequency input. Further detail on similar component modules can be found in the '504 patent discussed above.

Extending downward from a bottom surface 62 of the module body 60 are plural electrical pin connectors 64 for establishing electrical connection between the module's electrical components and the interposer 56. In the embodiment shown in FIGS. 2 and 3, there are four pin connectors 64 which enable the component module 54 to include both an electrochemical cell for chip back-up power and a crystal resonator for setting the frequency of an oscillator circuit in a semiconductor device (not shown) in the chip package 58. Of course, it will be appreciated that more or fewer pin connectors 64 can be employed depending on the electrical devices enclosed within the module body 60.

Extending downward from opposite ends 66, 67 of the bottom surface 62 of the module body 60 are plural clip members 68 that releasably, physically couple the component module 54 to the interposer 56. The clip members 68 each include a main portion 70 that extends generally downward from the module body 60 and a hook portion 72 that extends inwardly toward a corresponding clip member at an opposite end of the bottom surface 62 of the module body 60. When the component module 54 is coupled to the interposer 56, the main portions 70 of the clip member 68 extend along sides 74 of the interposer 56 and the hook portions 72 engage lower surfaces 76 of the interposer 56 to securely, yet releasably, couple the component module 54 to the interposer 56 as shown in more detail in FIG. 5. Also extending downward from the bottom surface 62 of the module body 60 is a polarizing tab 77 that prevents the component module 54 from being attached backwards on the interposer 56 as discussed in more detail below with respect to FIG. 4.

The interposer 56 includes plural electrical sockets 78 sized and positioned to mate with the pin connectors 64 to electrically connect the component module 54 with the interposer 56. The electrical sockets 78 extend completely through the interposer 56 and each include a terminal 80 that is connected by conventional means, such as solder, to electrical contacts 82 on a top surface 84 of the chip package 58. Such an interposer 56 with the sockets 78 can be implemented using pin grid array (PGA) socket module that typically are surface mounted directly to a printed circuit board. Such PGA socket modules can be obtained from several manufacturers such as Advanced Interconnections, Inc.

Typically, such sealed PGA socket modules are employed to connect devices with numerous pins to a printed circuit board. Normally, frictional forces between the pin connectors and the sockets are sufficient for retention of the removable device. These frictional forces are normally quite low individually, on the order of tens of grams, for example. However, given the large number of these interconnections typically employed, the cumulative retention force is relatively high. In addition, the device being coupled to the PCB via the PGA socket modules typically is of a relatively low mass so that only low retention forces are required to securely couple the device to the sealed PGA sockets.

Figure 1:
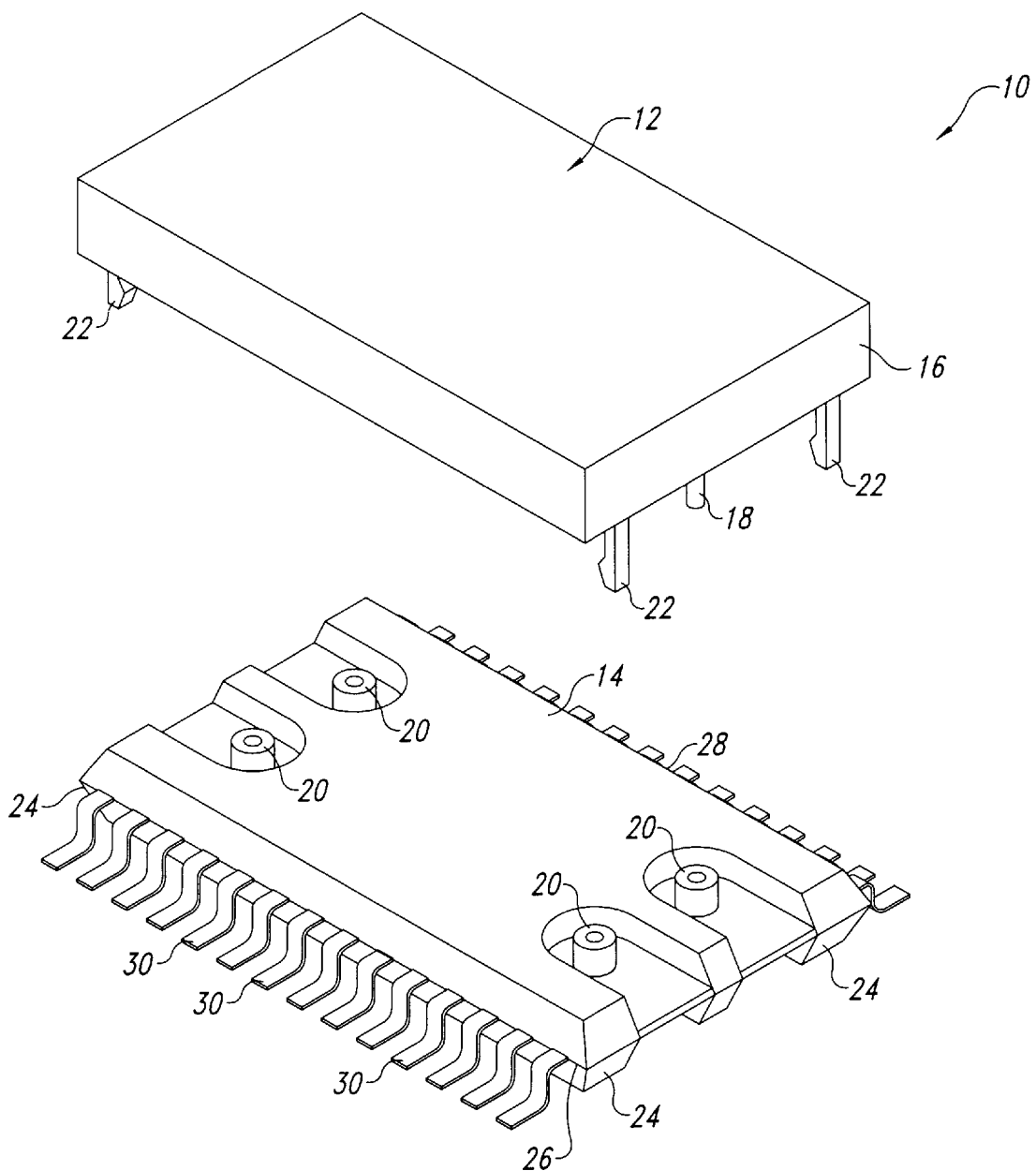
FIG. 1 is an exploded perspective view of an integrated circuit package according to the prior art.

Given that the component module 54 shown in FIG. 2 includes only a few pin connectors 64, the retention forces provided by the connection of the pin connectors to the sockets 78 is relatively low. Moreover, the mass of the component module 54 is relatively high because of its construction and the weight of the components contained within the component module. As a result, the dynamic separation forces can be relatively high due to shock or vibration while the retention forces are low. Accordingly, the clip members 68 hold the component module 54 securely in place on the interposer 56. Alternatively, other structures for interlocking the component module 54 to the interposer 56 can be employed, such as traditional battery snap designs found on common nine volt batteries as shown in FIG. 1 of the '504 patent The chip package 58 includes a substrate member 86 that typically is ceramic or insulating laminate, like a typical circuit board. The chip package 58 also may include an overmold portion 88 that includes one or more integrated circuit chips. The IC chips may be bonded to a top surface 89 of the substrate member 86 and then potted or overmolded to create the overmold portion 88. Coupled to a bottom surface 90 of the substrate member 86 are an array of ball connectors 92 that couple the integrated circuit within the chip package 58 to contact terminals 94 on the PCB 52. The ball connectors 92 typically connected by soldering them to the contact terminals on the PCB 52. It will be appreciated that numerous other types of chip packages can be employed, such as a pin grid array (PGA) to provide an integrated circuit and couple the component module 54 and the interposer 56 to the PCB 52

Figure 3:
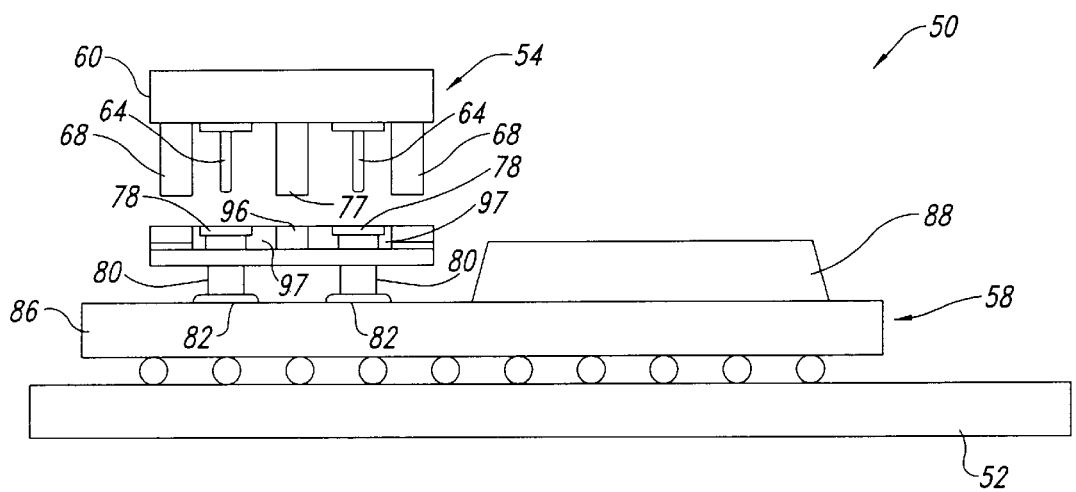
FIG. 3 is an exploded, side elevational view of the integrated circuit package of FIG. 2 rotated 90 degrees.

A side elevational view of the integrated circuit package 50, rotated 90° with respect to FIG. 2, is shown in FIG. 3. As can be seen more clearly in FIG. 3, the polarizing tab 77 extends downward from the module body 60 between two of the clip members 68. The interposer 56 includes a polarizing gap 96 that mates with the polarizing tab 77 when the component module 54 is properly coupled to the interposer 56. FIG. 3 also shows that the sockets 78 are positioned within cutouts 97 in the side 76 of the interposer 56.

Figure 4:
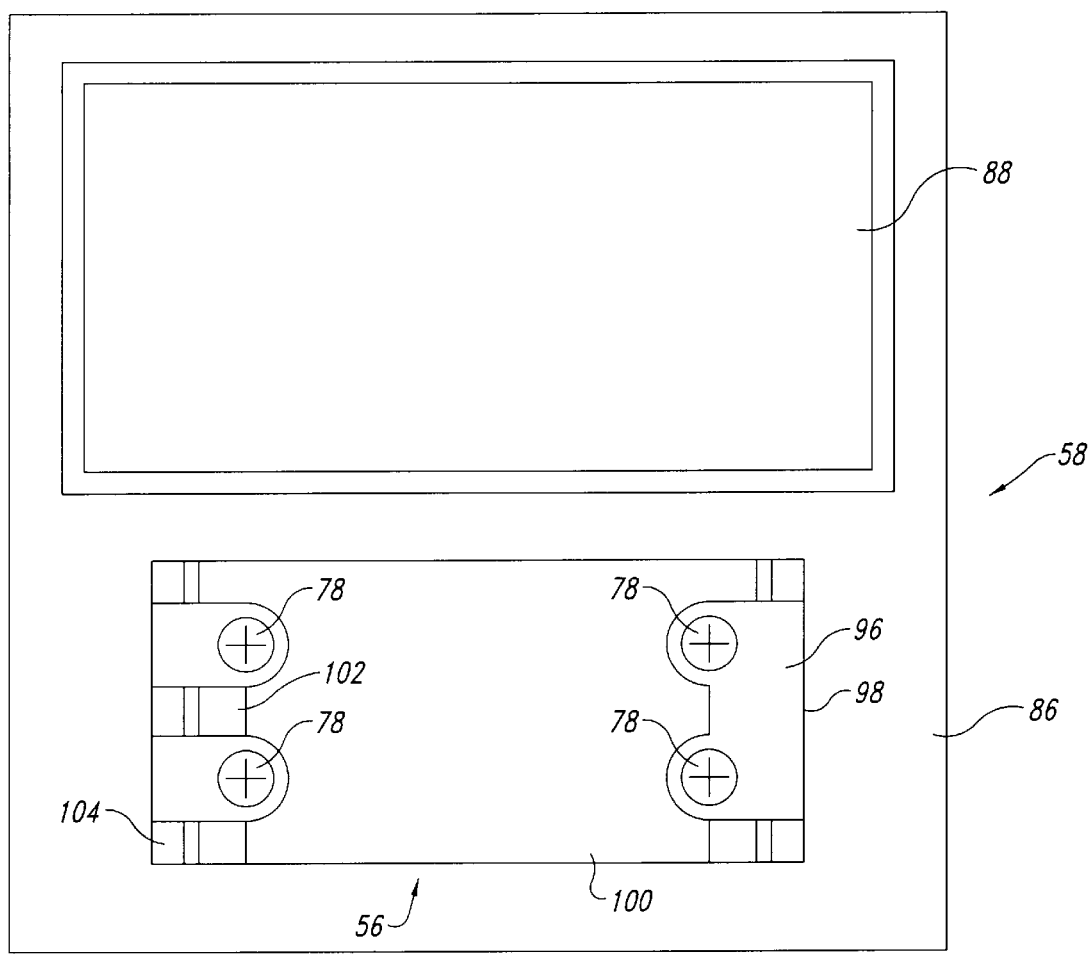
FIG. 4 is a plan view of a chip package and interposer of the integrated circuit package shown in FIG. 2.

A plan view of the interposer 56 and the chip package 58 is shown in FIG. 4. FIG. 4 shows the polarizing gap 96 formed at a first end 98 of a top side 100 of the interposer 56. Conversely, a rigid polarizing surface 102 is formed at a second end 104 of the top side 100. If the component module 54 were placed backwards on the interposer 56, then the polarizing tab 77 of the component module 54 would butt against the polarizing surface 102 and prevent the component module 54 from being coupled to the interposer 56. This can be very important if, for example, the component module 54 or the chip package 58 could be rendered or permanently damaged by misorientation between the component module 54 and the interposer 56.

Figure 5:
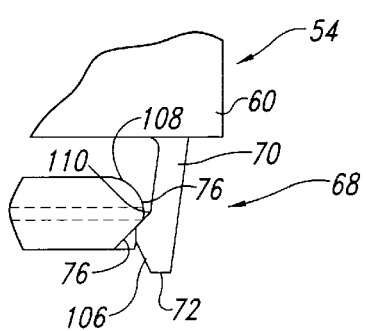
FIG. 5 is a detailed elevation view of a portion of the integrated circuit package of FIG. 2, illustrating an example of the snap-locking of a component module to the interposer.

An expanded side elevational view of a portion of the connection between the clip member 68 and the interposer 56 is shown in FIG. 5. The hook portion 72 of each clip member 68 includes a lower surface 106 that is sloped upward and inward. The sloped surface 106 cooperates with an upper sloped surface 108 on the interposer 56 during mounting, such that downward pressure on the component module 54 flexes the clip member 68 to the side 76 of the interposer 56. As the component module 54 continues to be pushed downwardly, the clip member 68 returns to its unflexed position at which a downwardly sloped surface 110 securely engages the upwardly sloped lower surface 76 of the interposer 56. This construction also provides an audible snapping sound to indicate to the human installer that secure mechanical connection has been achieved. Once installed in such a manner, the component module 54 cannot detach from the interposer 56 without an upward force sufficient to flex the clip members 68 around the edge side 76 of the interposer 56.

It will be appreciated that many changes to the connections between the component module 54, interposer 56, and chip package 58 can be made without departing from the invention. For example, rather than male pins 64 mating with female sockets 78, the component module 54 may have females connectors and the interposer 56 may have male connectors. Similarly, rather than a mating connection, one of the modules 54, 56 may have a spring connector while the other module 54, 56 has a planar connector that is engaged by the spring connector. Similarly, many other types of mechanical connectors could be employed in place of the clip member 68. Regardless of which connectors are employed, the use of the interposer 56 enables the component module 54 to be releasably and securely coupled to the chip package 58 even if the chip package is relatively thin or flexible. Alternatively, the interposer 56 may be affixed directly to the PCB 52, without employing a separate chip package 58.

It should be understood that even though numerous features and advantages of the present invention have been set forth in the foregoing description, the above disclosure is illustrative only. Changes may be made in detail and yet remain within the broad principles of the present invention.

What is claimed is:

1. A surface mountable integrated circuit package, comprising:
   a substrate member supporting an integrated circuit and having a plurality of electrical connectors;
   a component module having a plurality of electrical connectors extending from a module body; and
   a rigid interposer coupling the component module to the substrate member, the interposer including a plurality of electrical connectors coupling the electrical connectors of the component module to the electrical connectors of the substrate member, the plurality of electrical connectors of the interposer soldered to the plurality of electrical connectors of the substrate member to surface mount the interposer to the substrate member.

2. The integrated circuit package of claim 1 wherein the component module includes a plurality of clip members extending from a peripheral edge of a bottom surface of the module body, each clip member including a main portion that extends along a side of the interposer and a hook portion that engages a lower side of the interposer to releasably couple the component module to the interposer.

3. The integrated circuit package of claim 1 wherein the electrical connectors of the component module are structured to be releasably coupled to the electrical connectors of the interposer.

4. The integrated circuit package of claim 1 wherein the electrical connectors of the component module include pins and the electrical connectors of the interposer include sockets structured to mate with the pins of the component module.

5. The integrated circuit package of claim 4 wherein each of the sockets extends through the interposer from a top end of the socket at which one of the pins enters the socket to a bottom end that is coupled to a corresponding one of the electrical connectors of the substrate member.

6. The integrated circuit package of claim 1 wherein the substrate member includes a ball grid array substrate having electrical ball connectors structured to be connected to a circuit board.

7. The integrated circuit package of claim 1 wherein the component module includes a polarizing feature at a first end, the interposer having a first end with a first polarizing feature shaped to mate with the polarizing feature of the component module when the first ends are adjacent to each other and a second end with a second polarizing feature shaped to butt against the polarizing feature of the component module when the second end of the interposer is adjacent to the first end of the component module so as to prevent the interposer from being coupled to the component module when the second end of the interposer is adjacent to the first end of the component module.

8. The integrated circuit package of claim 7 wherein the polarizing feature of the component module includes a tab and the first polarizing feature of the interposer includes a gap positioned and sized to receive the tab when the first ends are adjacent to each other and wherein the second polarizing feature of the interposer is a rigid surface that butts against the tab when the second end of the interposer includes adjacent to the first end of the component module.

9. A surface mountable integrated circuit package, comprising:
   a substrate member supporting an integrated circuit and having a plurality of electrical connectors;
   a component module having a module body and plurality of clip members extending from a peripheral edge of a bottom surface of the module body; and
   a rigid interposer coupling the component module to the substrate member, the interposer being structured to be engaged by the clip members to releasably couple the component module to the interposer, the interposer being surface mounted to the substrate member.

10. The integrated circuit package of claim 9 wherein each of the clip members includes a main portion that extends along a side of the interposer and a hook portion that engages a lower side of the interposer to releasably couple the component module to the interposer.

11. The integrated circuit package of claim 9 wherein the component module includes a plurality of electrical connectors extending from the module body and the interposer includes a plurality of electrical connectors releasably coupled to the electrical connectors of the component module.

12. The integrated circuit package of claim 11 wherein the electrical connectors of the interposer are coupled to the electrical connectors of the substrate member by soldering.

13. The integrated circuit package of claim 12 wherein the electrical connectors of the component module include pins and the electrical connectors of the interposer includes sockets structured to mate with the pins of the component module, the sockets including terminals that are electrically coupled and soldered to the electrical connectors of the substrate member.

14. The integrated circuit package of claim 9 wherein the substrate member includes a ball grid array substrate having electrical ball connectors structured to be connected to the circuit board.

15. The integrated circuit package of claim 9 wherein the component module includes a polarizing feature at a first end, the interposer having a first end with a first polarizing feature shaped to mate with the polarizing feature of the component module when the first ends are adjacent to each other and a second end with a second polarizing feature shaped to butt against the polarizing feature of the component module when the second end of the interposer is adjacent to the first end of the component module so as to prevent the interposer from being coupled to the component module when the second end of the interposer is adjacent to the first end of the component module.

16. The integrated circuit package of claim 15 wherein the polarizing feature of the component module includes a tab and the first polarizing feature of the interposer includes a gap positioned and sized to receive the tab when the first ends are adjacent to each other and wherein the second polarizing feature of the interposer includes a rigid surface that butts against the tab when the second end of the interposer is adjacent to the first end of the component module so as to prevent the interposer from being coupled to the component module when the second end of the interposer is adjacent to the first end of the component module.

17. A surface mountable integrated circuit package, comprising:

a substrate member having first and second sides, the first side having a plurality of first electrical connectors for connection to a circuit board, the second side having a plurality of second electrical connectors;

a component module having a module body, a plurality of clip members extending from the module body, and a plurality of electrical connector pins extending from the module body; and a rigid interposer mechanically and electrically coupling the component module to the substrate member, the interposer being structured to be engaged by the clip members to releasably couple the component module to the interposer, the interposer including a plurality of sockets each structured to receive a respective one of the electrical connector pins, each socket including an electrical terminal coupled to a respective one of the second electrical connectors of the substrate member, such that the sockets electrically couple the component module to the substrate member by surface mounting.

18. The integrated circuit package of claim 17 wherein each of the clip members includes a main portion that extends along a side of the interposer and a hook portion that engages a lower side of the interposer to releasably couple the component module to the interposer.

19. The integrated circuit package of claim 17 wherein the substrate member includes a ball grid array substrate having solder balls structured to be connected to the circuit board.

20. The integrated circuit package of claim 17 wherein:

the component module includes first and second ends with a tab extending from the first end toward the interposer; and the interposer includes first and second ends, the first end of the interposer having a gap positioned and sized to receive the tab when the first ends are adjacent to each other and the second end of the interposer has a rigid surface that butts against the tab when the second end of the interposer is adjacent to the first end of the component module so as to prevent the interposer from being coupled to the component module when the second end of the interposer is adjacent to the first end of the component module.

* * * * *

UNITED STATES PATENT AND TRADEMARK OFFICE
CERTIFICATE OF CORRECTION

PATENT NO.    : 5,994,774
DATED         : November 30, 1999
INVENTOR(S)   : Harry Michael Siegel et al.

It is certified that error appears in the above identified patent and that said Letters Patent is hereby corrected as shown below:

In column 4, line 14, after "surface" delete "84"

Signed and Sealed this

Twelfth Day of September, 2000

Attest:

Q. TODD DICKINSON

*Attesting Officer*     Director of Patents and Trademarks